US011182240B2

(12) United States Patent
Vanaparthy et al.

(10) Patent No.: US 11,182,240 B2
(45) Date of Patent: Nov. 23, 2021

(54) TECHNIQUES TO IMPROVE ERROR CORRECTION USING AN XOR REBUILD SCHEME OF MULTIPLE CODEWORDS AND PREVENT MISCORRECTION FROM READ REFERENCE VOLTAGE SHIFTS

(71) Applicant: Intel Corporation, Santa Clara, CA (US)

(72) Inventors: Santhosh K. Vanaparthy, Santa Clara, CA (US); Zion S. Kwok, Vancouver (CA); Ravi H. Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/032,567

(22) Filed: Sep. 25, 2020

(65) Prior Publication Data
US 2021/0013903 A1  Jan. 14, 2021

(51) Int. Cl.
| G06F 11/10 | (2006.01) |
| H03M 13/21 | (2006.01) |
| H03M 13/29 | (2006.01) |
| H03M 13/00 | (2006.01) |
| H03M 13/11 | (2006.01) |
| H03M 13/39 | (2006.01) |

(52) U.S. Cl.
CPC ..... *G06F 11/1016* (2013.01); *H03M 13/1111* (2013.01); *H03M 13/1177* (2013.01); *H03M 13/21* (2013.01); *H03M 13/2942* (2013.01); *H03M 13/3927* (2013.01); *H03M 13/617* (2013.01)

(58) Field of Classification Search
CPC .................................................. G06F 11/1016
See application file for complete search history.

(56) References Cited

U.S. PATENT DOCUMENTS

| 7,203,890 | B1 * | 4/2007 | Normoyle | ........... G06F 11/1016 714/763 |
| 7,293,221 | B1 * | 11/2007 | Wong | .................. G06F 11/1016 714/768 |
| 2002/0144210 | A1 * | 10/2002 | Borkenhagen | ........... G11C 7/24 714/805 |
| 2004/0237023 | A1 * | 11/2004 | Takahashi | ........... G11C 11/4076 714/768 |

\* cited by examiner

*Primary Examiner* — Joseph D Torres
(74) *Attorney, Agent, or Firm* — Compass IP Law PC

(57) ABSTRACT

Examples include techniques to improve error correction using an exclusive OR (XOR) rebuild scheme that includes two uncorrectable codewords. Examples include generation of soft XOR codewords using bits of correctable codewords to rebuild a codeword read from a memory that has uncorrectable errors and adjust bit reliability information to generate a new codeword having correctable errors. Examples also include techniques to prevent mis-correction due to read reference voltage shifts using non-linear transformations.

19 Claims, 17 Drawing Sheets

XOR Stripe Rebuild Scheme 500
(Prior Art)

| Address0 | Data0 | ECC Parity | CW 510-0 |
|---|---|---|---|
| Address1 | Data1 | ECC Parity | CW 510-1 |
| Address2 | Data2 | ECC Parity | CW 510-2 |

⋮

| AddressN | DataN | ECC Parity | CW 510-N |
|---|---|---|---|
| AddressN+1 | Data0 XOR Data1 XOR Data 2 XOR ... Data N | ECC Parity | XOR CW 520 |

RECEIVE ADDRESS INFORMATION FOR ERROR CORRECTION CODE (ECC) CODEWORDS, THE ADDRESS INFORMATION INDICATING ADDRESSES WHERE THE ECC CODEWORDS ARE TO BE WRITTEN TO A MEMORY BY A CONTROLLER OF A MEMORY DEVICE
802

APPLY AN XOR OR XNOR OPERATION TO ADDRESS INFORMATION THAT IS NOT STORED IN THE MEMORY OR APPLY A NON-LINEAR TRANSFORMATION FUNCTION TO THE ADDRESSES WHERE THE ECC CODEWORDS ARE TO BE WRITTEN
804

PROVIDE THE ADDRESS INFORMATION IN SOME FORM TO AN ECC ENCODER OF THE CONTROLLER FOR THE ECC ENCODER TO CALCULATE ECC PARITY FOR THE RESPECTIVE ECC CODEWORDS, WHEREIN THE ECC ENCODER IS TO GENERATE AN ADDITIONAL ECC CODEWORD TO BE WRITTEN TO MEMORY, DATA FOR THE ADDITIONAL ECC CODEWORD IS A BITWISE XOR OR XNOR OF THE ECC CODEWORDS TO BE WRITTEN TO THE MEMORY IN AN XOR STRIPE
806

RECEIVE ADDRESS INFORMATION ASSOCIATED WITH READING THE ECC CODEWORDS FROM THE MEMORY
808

PROVIDE THE ADDRESS INFORMATION TO AN ECC DECODER OF THE CONTROLLER FOR THE ECC DECODER TO DECODE THE ECC CODEWORDS READ FROM THE MEMORY
810

CHECK WHETHER OR NOT THE ADDRESS INFORMATION OBTAINED FROM THE DECODED ECC CODEWORDS MATCHES EXPECTED ADDRESS INFORMATION FOR THE ECC CODEWORDS
812

DETERMINE SEPARATE ADDRESSES WHERE THE ECC CODEWORDS ARE TO BE WRITTEN TO THE MEMORY BASED ON THE ADDRESS INFORMATION FOR THE ECC CODEWORDS
*1002*

GENERATE A FIRST SOFT XOR CODEWORD BY A BITWISE XOR OF BITS OF EACH ECC CODEWORD INCLUDED IN THE XOR STRIPE THAT REPRESENT THE SEPARATE ADDRESSES WHERE THE ECC CODEWORDS ARE TO BE WRITTEN TO THE MEMORY AND USING XOR OF THE SEPARATE ADDRESSES TO GENERATE AN ECC PARITY FOR THE FIRST SOFT XOR CODEWORD
*1004*

STORE THE FIRST SOFT XOR CODEWORD AT THE CONTROLLER FOR THE MEMORY DEVICE
*1006*

RECEIVE ECC CODEWORDS FROM THE MEMORY THAT ARE INCLUDED IN THE XOR STRIPE, THE ECC CODEWORDS READ FROM THE MEMORY INCLUDING TWO ECC CODEWORDS HAVING UNCORRECTABLE ERRORS AS DETERMINED BY THE ECC DECODER
*1008*

GENERATE A SECOND SOFT XOR CODEWORD BY A BITWISE XOR OF DATA BITS ENCODED IN EACH ECC CODEWORD INCLUDED IN THE XOR STRIPE THAT HAS CORRECTABLE ERRORS AND BY A BITWISE XOR OF ECC PARITY BITS IN EACH ECC CODEWORD THAT HAS CORRECTABLE ERRORS AND BY THE ECC PARITY BITS FOR THE FIRST SOFT XOR CODEWORD
*1010*

GENERATE A REBUILD CODEWORD FOR BITS OF DATA ENCODED IN A FIRST ECC CODEWORD OF THE TWO ECC CODEWORDS WITH UNCORRECTABLE ERRORS, THE REBUILD CODEWORD GENERATED BY A BITWISE XOR OF BITS REPRESENTING AN XOR OF CORRECTABLE DATA INCLUDED IN THE SECOND SOFT XOR CODEWORD WITH BITS OF DATA ENCODED IN A SECOND ECC CODEWORD OF THE TWO ECC CODEWORDS WITH UNCORRECTABLE ERRORS AND BY A BITWISE XOR OF BITS FOR ECC PARITY OF THE SECOND ECC CODEWORD WITH BITS FOR ECC PARITY OF THE SECOND SOFT XOR CODEWORD, THE REBUILD CODEWORD TO HAVE ASSOCIATED RELIABILITY INFORMATION INDICATING A RELIABILITY OF EACH BIT INCLUDED IN DATA AND ECC PARITY PORTIONS OF THE REBUILD CODEWORD
*1012*

COMPARE BITS INCLUDED IN THE DATA AND ECC PARITY PORTIONS OF THE REBUILD CODEWORD WITH CORRESPONDING BITS INCLUDED IN DATA AND ECC PARITY PORTIONS OF THE FIRST ECC CODEWORD
*1014*

ADJUST RELIABILITY INFORMATION ASSOCIATED WITH EACH BIT INCLUDED IN THE DATA AND ECC PARITY PORTIONS OF THE REBUILD CODEWORD TO INDICATE A HIGHER RELIABILITY FOR EACH BIT IN THE DATA AND ECC PARITY PORTIONS MATCHING CORRESPONDING BITS IN THE DATA AND ECC PARITY PORTIONS OF THE FIRST ECC CODEWORD AND INDICATE A LOWER RELIABILITY FOR EACH BIT IN THE DATA AND ECC PARITY PORTIONS NOT MATCHING CORRESPONDING BITS IN THE DATA AND ECC PARITY PORTIONS OF THE FIRST ECC CODEWORD
*1016*

GENERATE A NEW ECC CODEWORD FOR THE DATA ENCODED IN THE FIRST ECC CODEWORD, THE NEW ECC CODEWORD INCLUDING THE ADJUSTED RELIABILITY INFORMATION ASSOCIATED WITH EACH BIT INCLUDED IN THE DATA AND ECC PARITY PORTIONS OF THE REBUILD CODEWORD, THE NEW ECC CODEWORD TO BE USED BY THE ECC DECODER TO CORRECT PREVIOUSLY UNCORRECTABLE ERRORS IN THE FIRST ECC CODEWORD
*1018*

FIG. 10B

Storage Medium *1100*

Computer Executable Instructions for 800, 900, 1000

FIG. 11

TECHNIQUES TO IMPROVE ERROR
CORRECTION USING AN XOR REBUILD
SCHEME OF MULTIPLE CODEWORDS AND
PREVENT MISCORRECTION FROM READ
REFERENCE VOLTAGE SHIFTS

TECHNICAL FIELD

Examples described herein are generally related to techniques to improve error correction using an exclusive OR (XOR) rebuild scheme of multiple codewords stored in a memory.

BACKGROUND

Error correction of data retrieved from a memory that includes non-volatile types of memory such as, but not limited to, NAND flash memory may include use of an error correction code (ECC) scheme. The ECC scheme may include use of ECC encoded codewords to protect data or recover from errors related to data retrieved or read from the memory. ECC encoded data read from the memory may be able to identify and correct a given number of errors (e.g., bit errors). In some ECC schemes, ECC encoded data may include codewords having a combination of data and parity. Also, various additional protections for ECC schemes may be implemented to further protect data or recover from errors. The additional protections may include exclusive OR (XOR) stripes of multiple ECC encoded codewords. The XOR stripes may be arranged to store the multiple ECC encoded codewords across multiple memory dies or memory chips. If errors are detected while decoding an ECC encoded codeword included in the XOR stripe, an XOR rebuild of the ECC encoded codeword having the detected error may be invoked to recover data in the ECC encoded codeword. The additional protections may include techniques to mitigate the mis-correction that arises from read reference voltage shifts.

BRIEF DESCRIPTION OF THE DRAWINGS

FIGS. 5A-B illustrate an example XOR stripe rebuild scheme.
FIG. 8 illustrates an example first logic flow.
FIGS. 10A-B illustrate an example third logic flow.
FIG. 11 illustrates an example of a storage medium.

DETAILED DESCRIPTION

Figure 1:
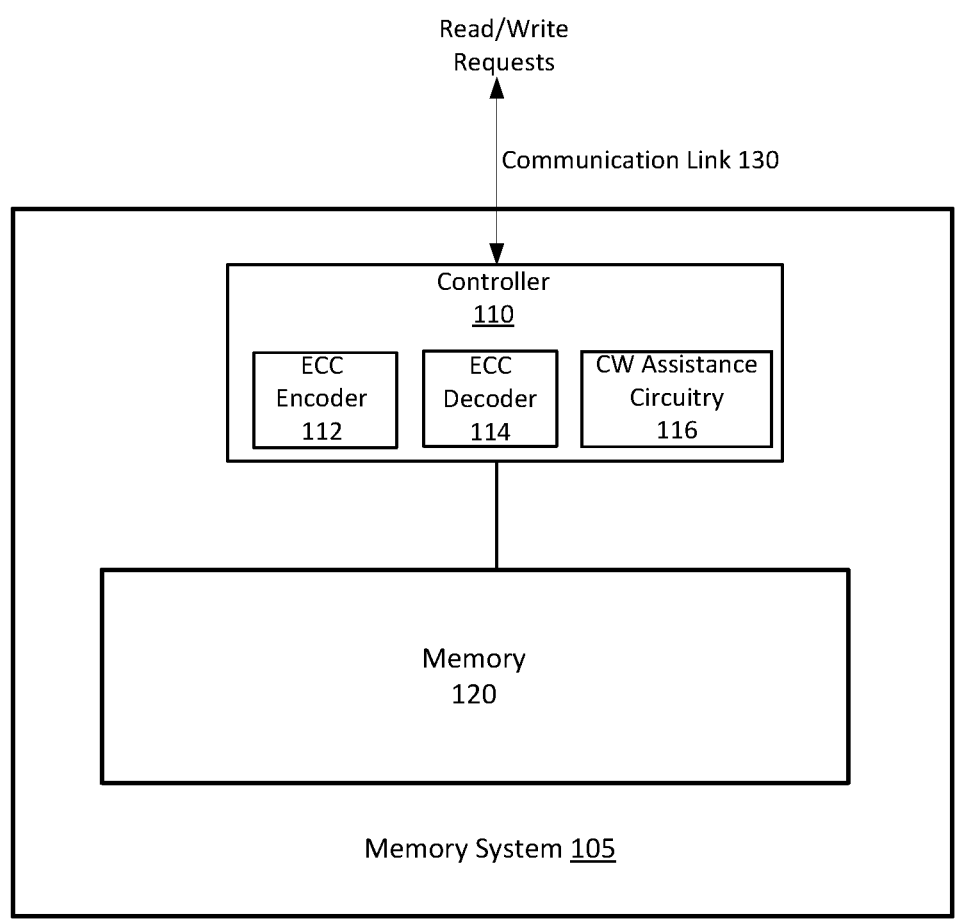
FIG. 1 illustrates an example first system.

In some examples, a memory device such as a solid state drive (SSD) may include a controller that may read or write data to a wrong physical address or logical block address (LBA) for non-volatile types of memory included in the memory device. Sometimes, defects in non-volatile types of memory, such as NAND flash memory, may result in reading a wrong page or combination of pages. In other instances, possible bugs in address indirection schemes may result in reading from a wrong physical address or LBA. ECC encoded codewords and/or XOR striping schemes may be able to detect and then correct these errors. However, if errors are not detected, silent data corruption may occur.

Example ECC schemes to protect data from being read from or written to a wrong physical address may include address verification techniques. A first address verification technique includes a controller of a memory device causing physical address information to be stored as part of metadata included in an ECC codeword. This first address verification technique includes the controller comparing the targeted physical address to the physical address information in the metadata following retrieval and decoding of the ECC codeword from non-volatile memory dies or chips of the memory device. If the physical address information indicates a match to the targeted physical address, any detected errors in the data may be correctable. If no match, detected errors are considered as uncorrectable. A potential issue associated with the first address verification technique is that storing physical address information as part of metadata uses up bits of an ECC codeword that could be used to store other information or additional ECC parity bits. The other information or additional ECC parity bits may be desirable to protect data from other, more problematic errors than occasional and/or sporadic misreads from a wrong physical address.

A second address verification technique may include a controller of a memory device encoding a physical address with data to generate an ECC parity. The physical address is not stored in non-volatile memory dies or chips of the memory device with the ECC codeword but is maintained at the controller. Following retrieval, the ECC codeword is decoded using the physical address maintained at the controller. If no errors are detected, the physical address and the data are both correct. If an error is detected in the physical address portion of the decoded ECC codeword, then an incorrect physical address was accessed. If an error is detected in non-physical address portions, the physical address was correct, and the error is correctable. If detected errors cannot be corrected by the ECC decoder, this may indicate errors in the physical address, the data or both and that the ECC codeword includes uncorrectable errors.

A potential issue associated with the second address verification technique may arise with memory devices including types of non-volatile memory such as NAND flash memory that implements multi-level cell programming to write data to the NAND flash memory (e.g., triple-level cell (TLC) or quad-level cell (QLC) programming). Typically, types of multi-level cell programming may have a write latency substantially longer than a write latency for single-level cell (SLC) programming. The relatively longer write latencies for types of multi-level cell programming may cause a controller of a memory device to switch to a faster SLC programming for writes that are in progress during an unexpected power loss (e.g., a power loss imminent event). The switch to SLC programming causes the data to be written to an SLC NAND page having a different address than what was used to encode the ECC codeword. Thus, when the ECC codeword is decoded, errors in the physical address will occur—even if the ECC codeword was retrieved from a correct physical address for the SLC NAND page.

As a result of the potential issues mentioned above for the first and second address verification techniques, a need exists for technique to improve ECC using memory device addresses such as physical addresses or LBAs. As described more below, these techniques may use less bits in an ECC codeword and/or potentially will not indicate errors in a physical address of data intended to be stored in a multi-level cell programmed NAND page but then stored in an SLC programmed NAND page due to, for example, an unexpected power loss.

FIG. 1 illustrates an example system 100. As shown in FIG. 1, system 100 includes a memory system 105 that includes a controller 110 and a memory 120. According to some examples, controller 110 may receive and/or fulfill read/write requests via communication link 130. Although not shown in FIG. 1, in some examples, communication link 130 may communicatively couple controller 110 to elements or features associated with an operating system for a computing device. For these examples, memory system 105 may be a memory device for the computing device. As a memory device, memory system 105 may serve as a two level memory (2LM) system or a solid state drive (SSD) for the computing device. As part of a 2LM system memory system 105 may serve as type of storage class or persistent memory device.

In some examples, as shown in FIG. 1, controller 110 may include an error correction code (ECC) encoder 112, an ECC decoder 114 and codeword (CW) assistance circuitry 116. ECC encoder 112 in cooperation with CW assistance circuitry 116 may separately include logic and/or features to generate codewords to protect data to be written to memory 120 from errors. As described in more detail below, CW assistance circuitry 116 may include logic and/or features to implement non-linear transforms of physical addresses or LBAs for use in codewords to protect data from errors and/or assist with implementation of an exclusive OR (XOR) stripe rebuild scheme to further protect the data from errors and correct detected error when the data is read from memory 120. According to some examples, the ECC used to encode the data may include, but is not limited to, a low-density parity-check (LDPC) code.

In some examples, memory 120 may include non-volatile and/or volatile types of memory. Volatile types of memory may include, but are not limited to, random-access memory (RAM), Dynamic RAM (DRAM), double data rate synchronous dynamic RAM (DDR SDRAM), static random-access memory (SRAM), thyristor RAM (T-RAM) or zero-capacitor RAM (Z-RAM). Non-volatile types of memory may include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

According to some examples where memory system 105 is configured as a 2LM system, memory system 100 may serve as main memory for a computing device. For these examples, memory 120 may include the two levels of memory including cached subsets of system disk level storage. In this configuration, the main memory may include "near memory" arranged to include volatile types of memory and "far memory" arranged to include volatile or non-volatile types of memory. The far memory may include volatile or non-volatile memory that may be larger and possibly slower than the volatile memory included in the near memory. The far memory may be presented as "main memory" to an operating system (OS) for the computing device while the near memory is a cache for the far memory that is transparent to the OS. The management of the 2LM system may be done by a combination of logic and modules executed via either controller 110 and/or processing circuitry (e.g., a CPU) for the computing device. Near memory may be coupled to the processing circuitry via high bandwidth, low latency means for efficient processing. Far memory may be coupled to the processing circuitry via relatively low bandwidth, high latency mean.

Figure 2:
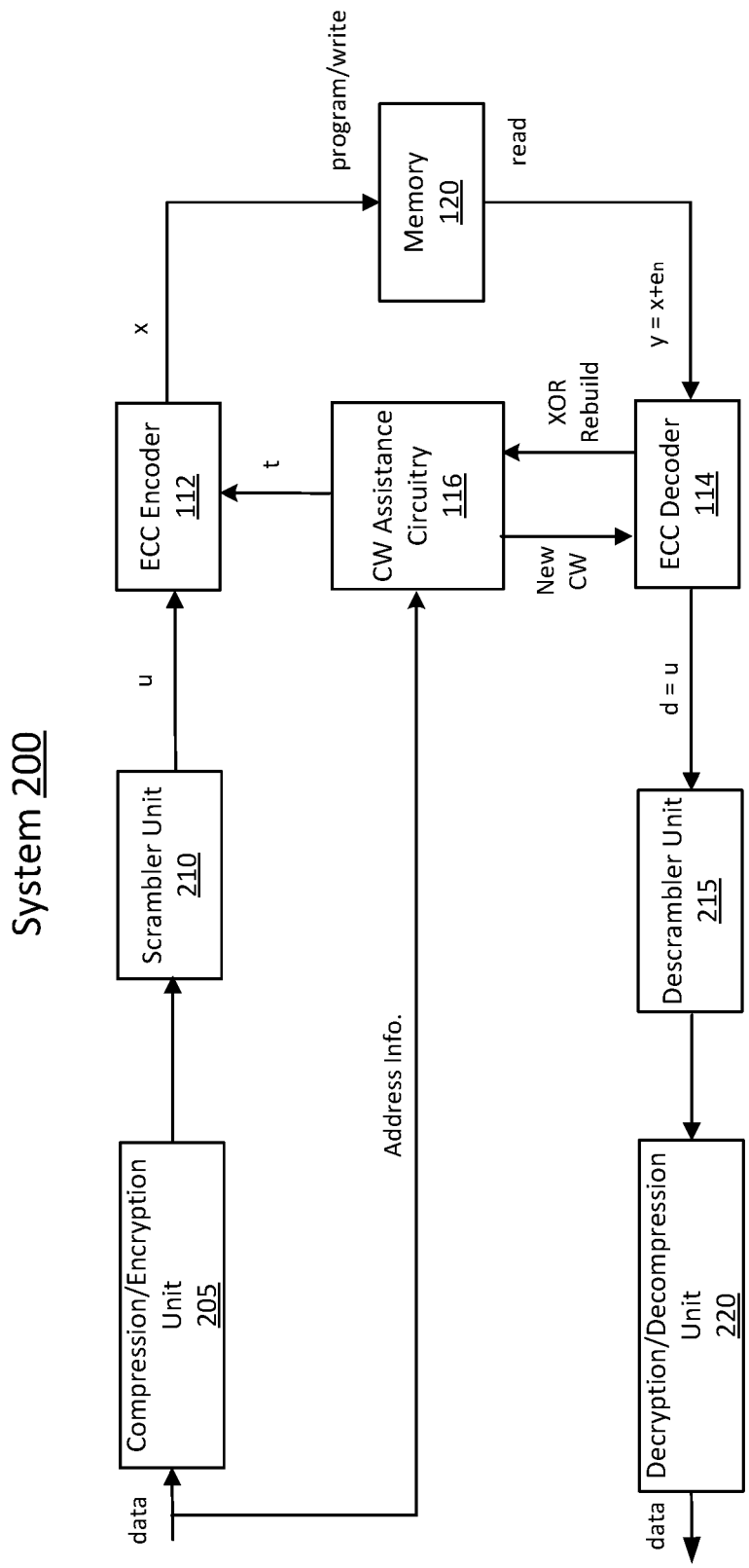
FIG. 2 illustrates an example second system.

FIG. 2 illustrates an example system 200. In some examples, as shown in FIG. 2, system 200 includes a compression/encryption unit 205, ECC encoder 112, a scrambler unit 210, memory 120, a descrambler unit 215, ECC decoder 114, CW assistance circuitry 116 and a decryption/decompression unit 220.

According to some examples, as shown in FIG. 2, compression/encryption of data at compression/encryption unit 205 followed by scrambling of data at scrambler unit 210 may result in "u" that is provided to ECC encoder 112. As described more below, logic and/or features of CW assistance circuitry 116 may receive address information (e.g., from controller 110) indicating where data is to be written to in memory 120. The address information may include an LBA or physical address. The logic and/or features of CW assistance circuitry 116 may implement a non-linear transformation "t" of the LBA or physical address and provide t to ECC encoder 112 to generate an ECC parity using t. ECC encoder 112 may then generate a codeword "x" using an ECC code (e.g., LDPC). Codeword "x" may be programmed or written to memory 120. The codeword may be read from memory 120 to obtain a codeword "y". As shown in FIG. 2, $y=x+e_n$, where "$e_n$" represents errors possibly introduced during the writing then reading of x from memory 120 and "n" represents the number of errors possibly introduced during the write to and subsequent read from memory 120.

In some examples, ECC decoder 114 may receive y. ECC decoder 114 may decode y and determine that n equals a number of errors that exceeds the correction capacity of the ECC code. As mentioned in more detail below, a soft XOR rebuild scheme may be implemented by logic and/or features of CW assistance circuitry 116 to verify an address information for y and rebuild y to attempt to provide additional soft error correction protection to increase the correction capacity of the ECC code.

According to some examples, ECC decoder 114 may receive y and possibly correct identified errors to generate "d". The correcting may or may not include use of an XOR stripe rebuild scheme. For example, if y was encoded using an LDPC code and the LDPC code is able to correct $e_n$ in y, then the XOR stripe rebuild scheme is not needed. As shown in FIG. 2, if the errors were correctable (e.g., using LDPC and/or XOR stripe rebuild), d=u. Descrambler unit 215 may then descramble the data u, and then Decryption/Decompression unit 220 may then decrypt/decompress the descrambled data to generate data originally compressed/encrypted by compression/encryption unit 205.

Figure 3:
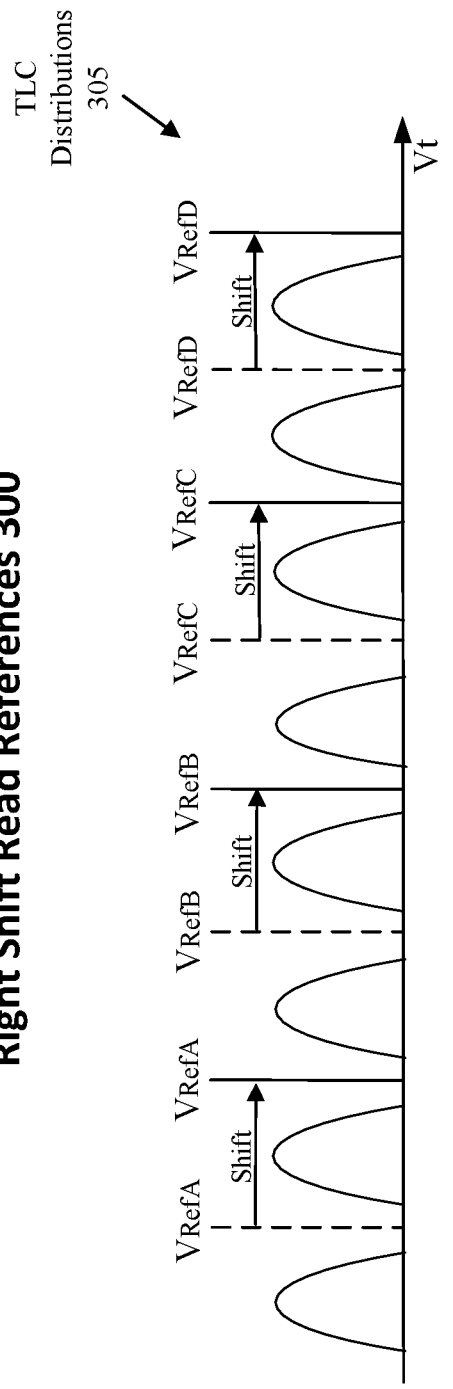
FIG. 3 illustrates example right shift read references.

FIG. 3 illustrates example right shift read references 300. In some examples, as shown in FIG. 3, right shift read references 300 may indicate how a right shift of read reference voltages $V_{RefA}$, $V_{RefB}$, $V_{RefC}$ and $V_{RefD}$ to read extra page (XP) bits may shift for bits written to or programmed to a memory having triple-level cell (TLC) distributions 305. A right shift may be due to various characteristics of the memory such as, but not limited to, read/write endurance cycles or operating temperatures.

According to some examples, as shown in FIG. 3, the right shift is indicated by initial read reference voltages $V_{RefA}$, $V_{RefB}$, $V_{RefC}$ and $V_{RefD}$ separately having a dash line that is shifted one full distribution to the right along the voltage threshold (Vt) axis to a solid line for TLC distributions 305. For example, $V_{RefA}$ is shifted such that it will be on the right side of the first and second distributions for TLC distributions 305 starting from the left end of the Vt axis. As a result of right shift read references 300, a codeword read from a memory cell having TLC distributions 305 may lead to mis-corrects of XP bits because the read resulted in an exclusive NOR (XNOR) of lower page (LP) bits with upper page (UP) bits. Also, an inherent linearity of ECC codewords such as cyclic redundancy check (CRC) or LDPC codewords may fail to identify and thus correct for these mis-corrects due to the linear shift to the right. As shown in FIG. 3, example XP bits read from a memory (e.g., a NAND flash memory) of 10011001 using right shifted voltage references 300 results in an XNOR of respective LP and UP bits for TLC distributions 305.

Figure 4:
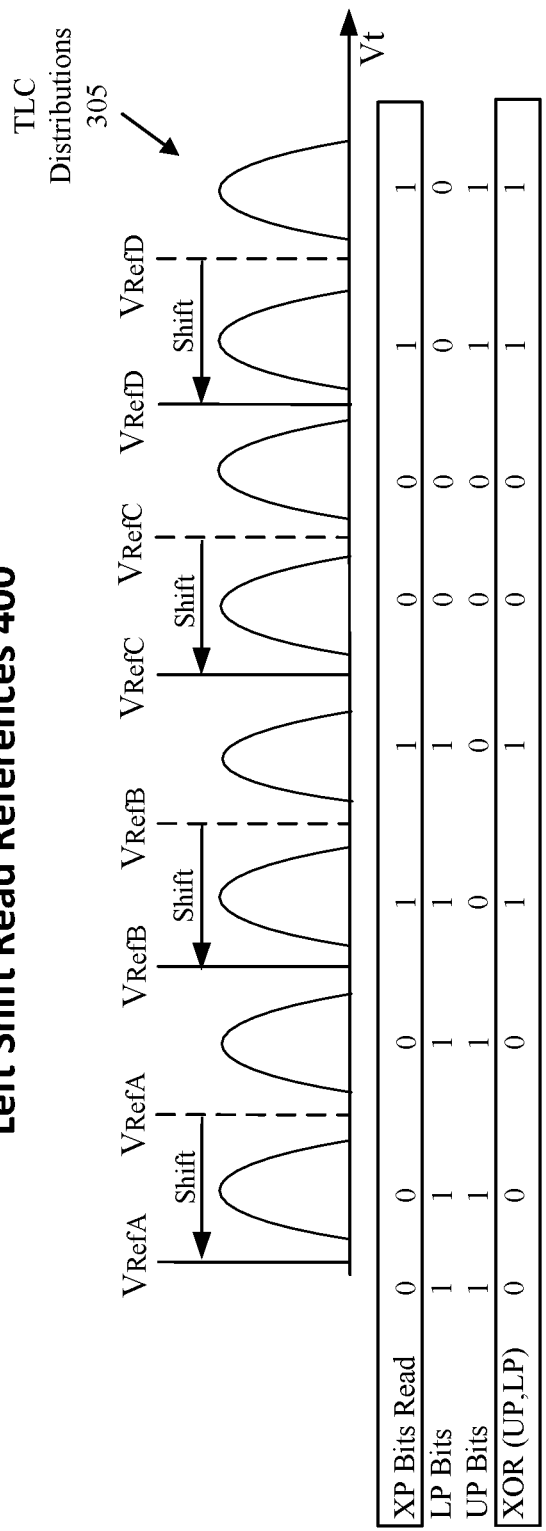
FIG. 4 illustrates an example left shift read references.

FIG. 4 illustrates example left shift read references 400. In some examples, as shown in FIG. 4, left shift read references 400 may indicate how a left shift of read reference voltages $V_{RefA}$, $V_{RefB}$, $V_{RefC}$ and $V_{RefD}$ to read XP bits may shift for bits written to or programmed to a memory having the same TLC distributions 305 also shown in FIG. 3. A left shift may be due to various characteristics of the memory such as, but not limited to, read/write endurance cycles or operating temperatures.

According to some examples, as shown in FIG. 4, the left shift is indicated by initial read reference voltages $V_{RefA}$, $V_{RefB}$, $V_{RefC}$ and $V_{RefD}$ separately having a dash line that is shifted one full distribution to the left along the Vt axis to a solid line for TLC distributions 305. For example, $V_{RefA}$ is shifted such that it will be on the left side of the first distribution for TLC distributions 305 starting from the left end of the Vt axis. As a result of left shift read references 400, a codeword read from a memory cell having TLC distributions 305 may lead to mis-corrects of XP bits using an XOR of LP bits with UP bits. Also, as mentioned above, an inherent linearity of ECC codewords such as CRC or LDPC codewords may fail to identify and thus correct for these mis-corrects due to a linear shift to the left. As shown in FIG. 4, example XP bits read from a memory (e.g., a NAND flash memory) of 000110011 using the left shift voltage references 400 results in an XOR of respective LP and UP bits for TLC distributions 305.

The example right or left shift read references described above are not limited to TLC distributions for writing to or programming to a memory. Similar mis-corrects may occur for other types of cell level distributions, such as, but not limited to multi-level cell (MLC) or quad-level cell (QLC) or penta-level cell (PLC) distributions. Also, with QLC programming using 16 distributions and PLC programming using 32 distributions to read values, relatively smaller right/left read reference shifts than those shown in FIGS. 3 and 4 could lead to mis-corrects.

Figure 5B:
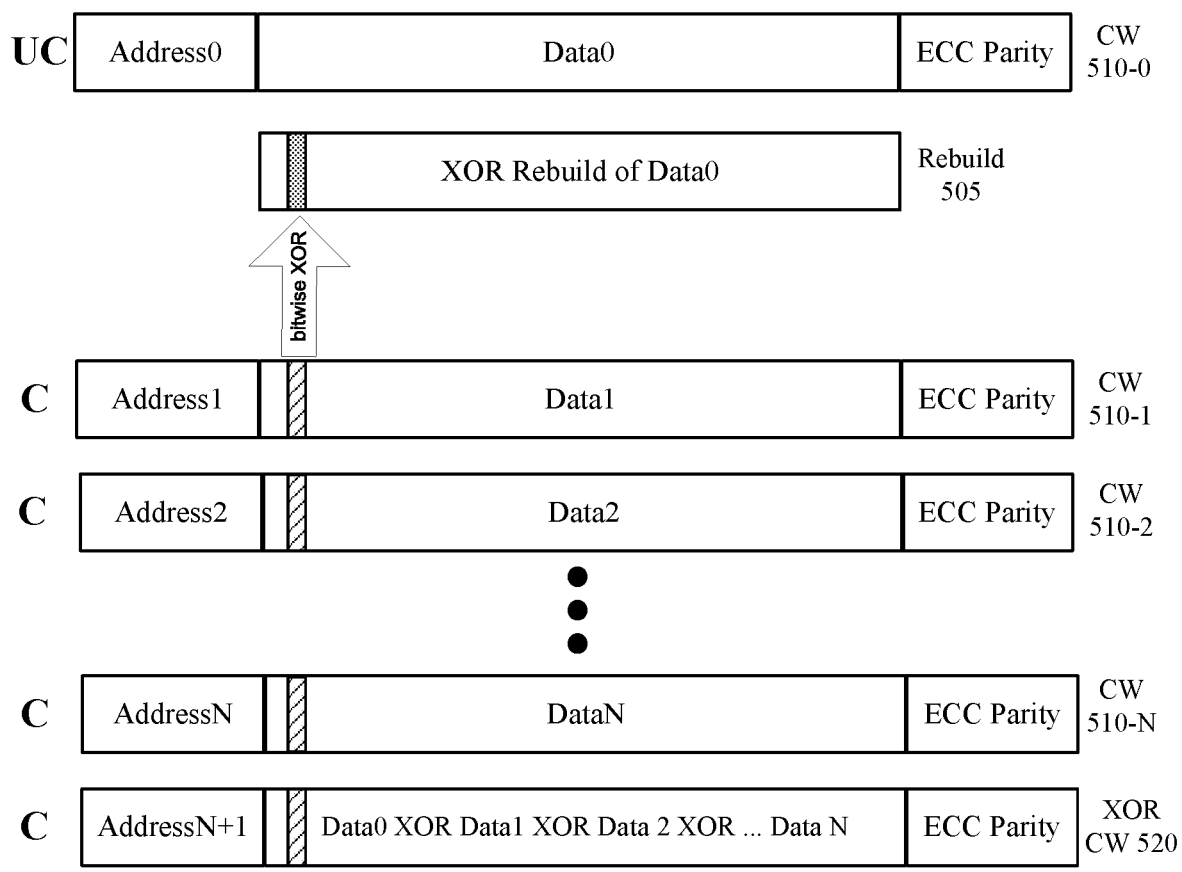

FIGS. 5A-B illustrate an example XOR stripe rebuild scheme 500. In some examples, as shown in FIG. 5A, XOR stripe rebuild scheme 500 includes N codewords CW 510-0 to CW 510-N, where "N" represents any whole positive integer>2, and XOR CW 520. For these examples, each codeword included in CWs 510-0 to 510-N may include bits to represent an address (physical or LBA), bits to represent data and bits to represent ECC parity. The address is to be based on a physical address or LBA to where the data is to be written in a memory. The ECC parity for each codeword, for example, may be generated by encoding the data to be written to the memory with the bits representing the address.

In some examples, XOR CW 520 may also be stored to the memory at an address represented by bits N+1 of XOR CW 520. XOR CW 520 may include XOR'ed data from each of CWs 510-0 to 510-N to generate an XOR stripe. The ECC parity for XOR CW 520, for example may be generated by encoding the XOR stripe with address N+1.

According to some examples, the XOR stripe maintained in XOR CW 520 may be able to use correctable codewords (codewords having correctable errors) to correct an uncorrectable codeword (codeword having uncorrectable errors). For example, as shown in FIG. 5B, CW 510-0 may be uncorrectable "UC" (e.g., a decoder was unable to correct all detected errors when decoding data read from the memory) but CWs 510-1 to 510-N and XOR CW 520 may be correctable "C". Codewords may be uncorrectable "UC" for various reasons including, but not limited to, random bit errors, defects in the memory, charge loss, charge gain, or having an address mismatch. For this example, an XOR rebuild of Data® included in CW 510-0 may be generated via calculating a bitwise XOR of data from the correctable codewords to generate rebuild 505. If two or more codewords among CWs 510-0 to 510-N or XOR CW520 are uncorrectable, it may not be possible to correct the uncorrectable codewords.

Figure 6A:
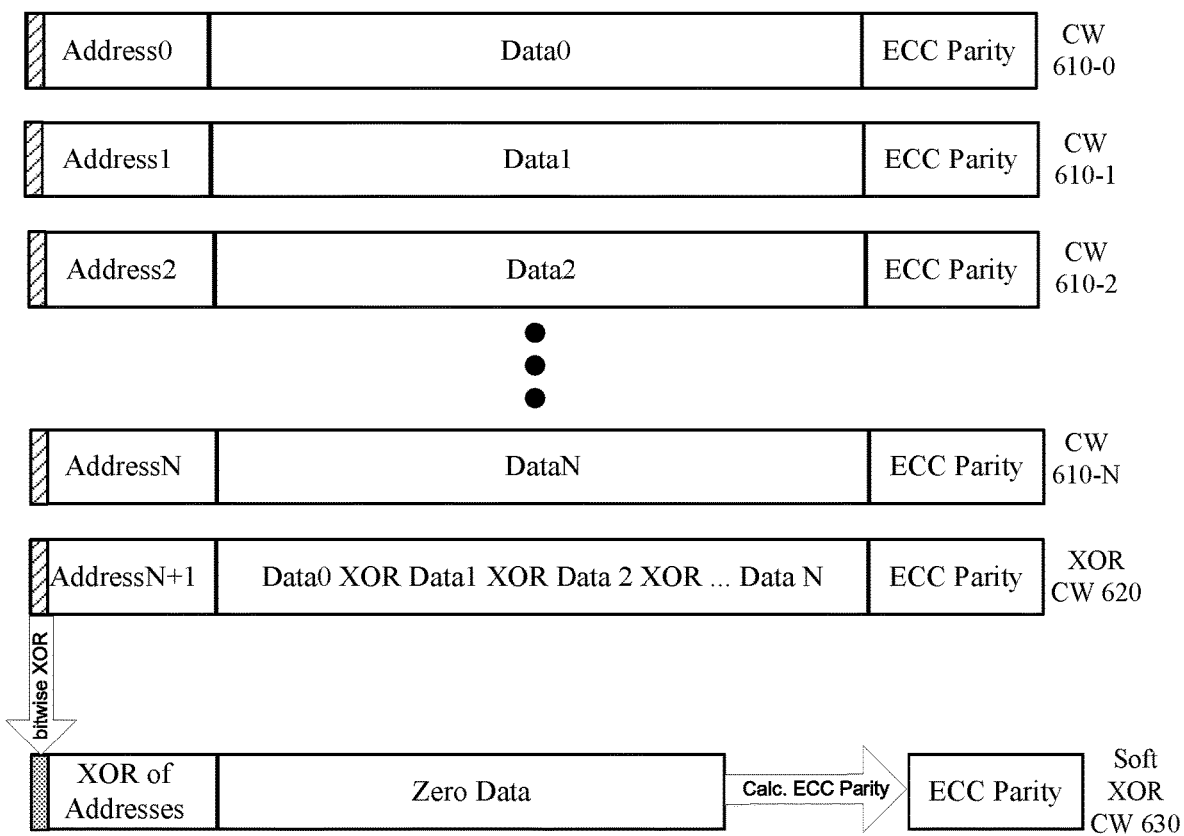
FIGS. 6A-D illustrate an example soft XOR rebuild scheme.

FIGS. 6A-D illustrate an example soft XOR stripe rebuild scheme 600. Soft XOR stripe rebuild scheme 600 may be implemented to mitigate issues associated with multiple UC codewords as mentioned above for XOR stripe rebuild scheme 500. In some examples, soft XOR stripe rebuild scheme 600 may implement a type of error correction known as soft XOR with parity. For these examples, additional XOR parity information is implemented by circuitry at a controller for a memory device to improve correction strength for data encoded in codewords stored to a memory of the memory device. As shown in FIG. 6A, a similar XOR striping scheme to what is shown in FIG. 5A is used for codewords CWs 610-0 to 610-N to generate XOR CW 620. In addition, a soft XOR CW 630 that includes XORing address bits for CWs 610-0 to 610-N and address bits for XOR CW 620, adding zero data to the XOR'd address bits, and then calculating ECC parity to complete soft XOR CW 630. For soft XOR rebuild scheme 600, soft XOR CW 630 is not written to the memory of the memory device. Because it can be generated from known address values, soft XOR CW 630 can be generated only when two or more codewords are UC and soft XOR rebuild is needed. The subsequent use of soft XOR CW 630 when correcting uncorrectable codewords is mentioned in more detail below.

Figure 6B:
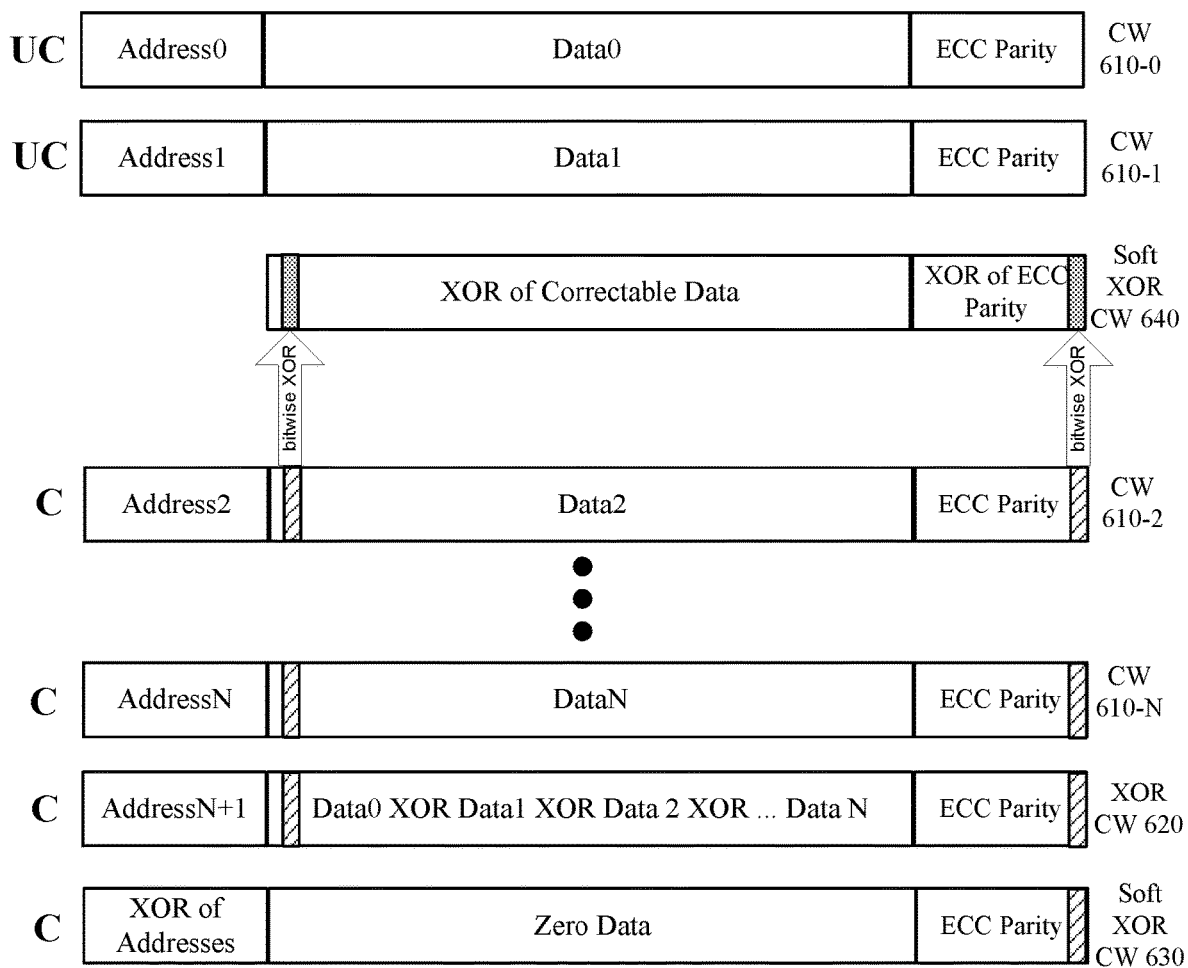

In some examples, as shown in FIG. 6B, CWs 610-0 and 610-1 may be uncorrectable by a decoder at the controller of the memory device and CWs 610-2 to 610-N and XOR CW 620 may be correctable by the decoder. Also, soft XOR CW 630 is considered as a correctable codeword. For these examples, soft XOR rebuild scheme 600 may include calculating a bitwise XOR of bits in the data and parity portions from correctable CWs 610-2 to 610-n, correctable XOR CW 620 and soft XOR CW 630 to generate an XOR of correctable data and also calculating bitwise XOR of ECC parity bits from correctable CWs 610-2 to 610-N, correctable XOR CW 620 and soft XOR CW 630 to generate an XOR of ECC parity to include in soft XOR CW 640.

Figure 6C:
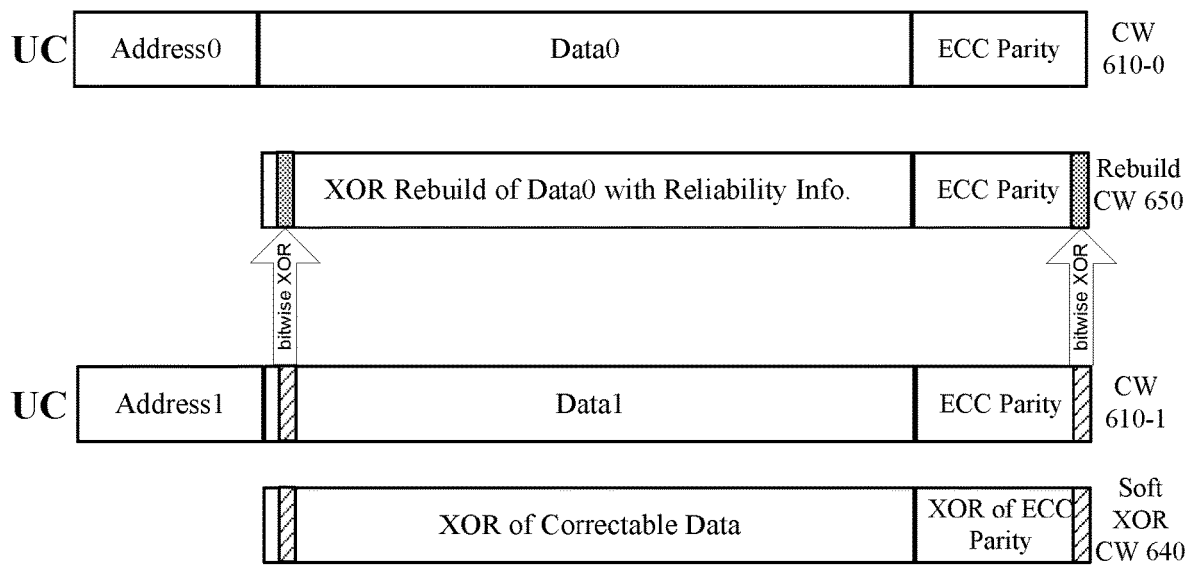

According to some examples, as shown in FIG. 6C, an XOR rebuild of Data® with reliability may be generated based on calculating a bitwise XOR of the bits for XOR of correctable data included in soft XOR CW 640 with bits for Data1 included in CW 610-1. Also, a new ECC parity is generated by calculating a bitwise XOR of the bits of XOR of ECC parity included in soft XOR CW 640 with the bits of ECC parity included in CW 610-1. The calculated XOR rebuild of Data® and newly calculated ECC parity are included in rebuild CW 650. In addition, reliability information indicating a lowest reliability for each bit included in XOR rebuild of Data® and the ECC parity for rebuild CW 650 is maintained (e.g., with metadata for rebuild CW 650).

In some examples, reliability information may be used to improve the correcting strength of some ECC codewords such as, but not limited to LDPC codewords. For these examples, reliability may be indicated using logarithms of probabilities such as a log-likelihood ratio (LLR). According to some examples, if LLR indicates a number less than 0 for a given bit stored to a memory is more likely to have a value of 1, the stored value may be referred to as "s". Also, if LLR indicates a number greater than 0 for the given bit when read from the memory, the given bit is more likely to have a value of 0, the read value may be referred to as "r". Example equation (1) illustrates an example of this concept for LLR.

$$LLR(r) = \ln\frac{p(s=0|r)}{p(s=1|r)} = \ln\frac{p(r|s=0)}{p(r|s=1)} \quad \text{Equation (1)}$$

In some examples, reliability information may be predetermined for bits stored to physical memory addresses of a memory. For example, multiple reads of a bit stored to the memory may be made using different read reference voltages to obtain an approximation of a Vt for a memory cell at a given physical memory address. Thus, an LLR may be assigned to the bit based on what actual read reference voltage is used when reading data programmed or written to the bit.

Figure 6D:
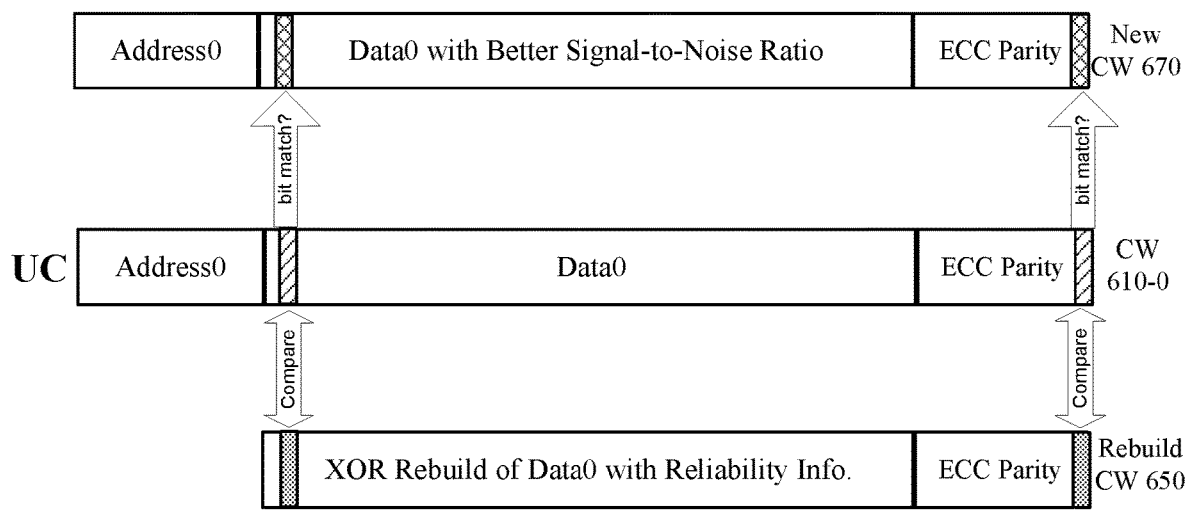

According to some examples, as shown in FIG. 6D, soft XOR rebuild scheme 600 further includes comparing bits included in XOR rebuild of Data® and ECC parity in rebuild CW 650 with bits for Data® and ECC parity in CW 610-0. For this example, if corresponding bits between the two codewords match, reliability information is adjusted to indicate that a matching bit has a read value that is more reliable or has a higher probability of being what was originally stored. If corresponding bits between the two codewords do not match, reliability information is adjusted to indicate that a non-matching bit has a read value that is less reliable or has a lower probability of being what was originally stored. These adjustments to reliabilities may increase or improve a signal-to-noise ratio for bits of Data® and may increase a likelihood that a decoder will be able to correct errors in Address® and/or Data® when decoding new CW 670 that were previously uncorrectable in CW 610-0.

In a first example, the memory to store CWs 610-0 to 610-N and XOR CW 620 may include NAND flash memory. For this first example, when TLC programming is used to store Data® to DataN in CWs 610-0 to 610-N and the XOR of Data® to DataN to TLC NAND pages and a power loss event occurs during the writing or programming of these codewords, a shift to quicker or lower latency SLC programming to SLC NAND pages may occur. The physical addresses represented by the address bits of CWs 610-0 to 610-N and XOR CW 620 corresponding to TLC NAND pages will not match the physical addresses for SLC NAND pages when CWs 610-0 to 610-N and XOR CW 620 are read from the SLC NAND pages.

In a second example, logical addresses (e.g., LBAs) may be used instead of physical addresses for address verification of CWs 610-0 to 610-N and XOR CW 620. For this second example, the logical address may not be known. Hence, a verification of the physical address is not possible, and any physical address misreads that may be causing a high number of errors would go undetected.

In a third example, a codeword that is not part of an XOR stripe is read when the logical address is not known.

For either the first or second or third example, an address check for CWs 610-0 to 610-N and XOR CW 620 may be disabled so that these codewords do not trigger an error flag or error condition of a memory device following a power loss event or if physical addresses are not known when using LBAs for codewords.

According to some examples, before encoding CWs 610-0 to 610-N and XOR CW 620, respective bits representing Address0 to AddressN+1 may go through a non-linear transformation. For example, if TLC programming is used to write CWs 610-0 to 610-N and XOR CW 620, the non-linear transformation (NLT) may help to mitigate right or left read reference shifts as mentioned above for FIGS. 3 and 4. Each NLT of the respective bits representing Address0 to AddressN+1 may be such that post-transformation, the XOR/XNOR of "transformed address information" for LP, UP will not match an address of XP post-transformation. For example, NLT(ADDR_LP) XOR NLT(ADDR_UP)≠NLT(ADDR_XP), where "ADDR" represents address bits included in CWs 610-0 to 610-N and XOR CW 620—post transformation.

In some examples, non-linear transformation functions may be used to generate a large hash output that inputs the separate bit values representing physical addresses for Address0 to AddressN+1 of respective CWs 610-0 to 610-N and XOR CW 620 to create separate NLTs to represent physical addresses. For these examples, the NLTs are then used to calculate an ECC parity and the NLTs are not necessarily stored with CWs 610-0 to 610-N and XOR CW 620 at a memory. Rather, the NLTs are maintained at the controller of the memory device (e.g., non-linear transform buffer 712) that are indexed by the physical addresses. Or else the NLT can be discarded after the write to the memory device and calculated later from using the read physical address when reading from the memory device. When CWs 610-0 to 610-N and XOR CW 620 are read and attempts are made at the controller to decode these codewords, NLT information maintained at the controller or NLT information recalculated by the controller is used to verify address information and/or correct errors with the address information. Example non-linear transformation functions may include, but are not limited to, being implemented with look-up tables (LUTs). For example, to implement a 128-bit transformation, the address information may be interleaved and combined using logic gates to generate 16 bytes. Each byte can be used as the index to a different LUT. Then the outputs from the 16 different LUTs may be interleaved and combined using logic gates. It may also be possible to introduce non-linear transformations via use of "AND" and "OR" logic gates to mix respective bits representing Address0 to AddressN+1

In some examples, a non-linear transformation is applied to address information for ECC codewords that are not part of an XOR stripe.

Figure 7:
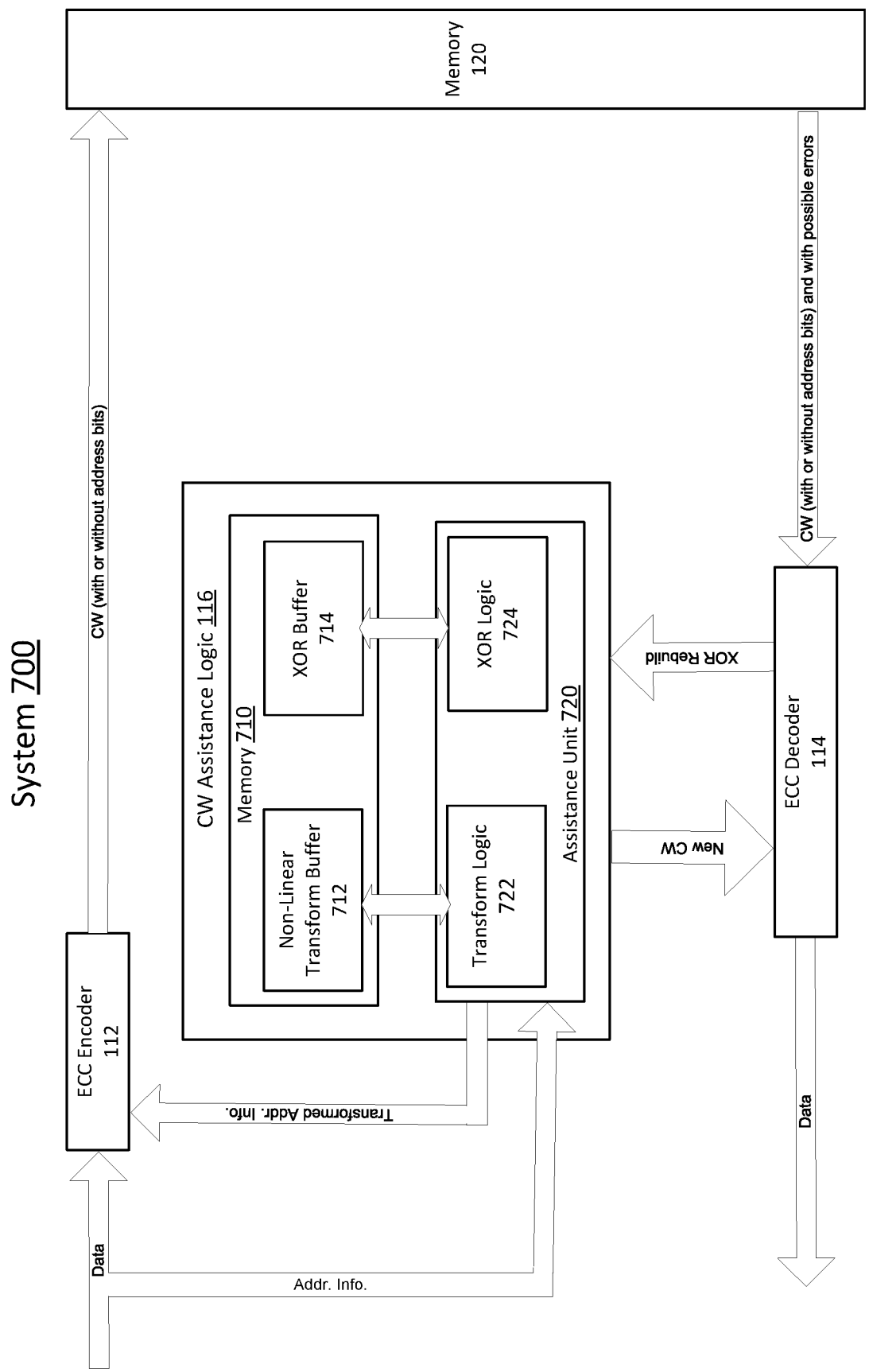
FIG. 7 illustrates an example third system.

FIG. 7 illustrates an example system 700. In some examples, as shown in FIG. 7, system 700 includes ECC encoder 112, memory 120, ECC decoder 114 and CW assistance circuitry 116. Also, CW assistance circuitry 116 is shown as including a memory 710 and an assistance unit 720.

In some examples, data (possibly encrypted/compressed) to be stored to memory 120 at various physical addresses or LBAs of memory 120 may be encoded by ECC encoder 112 in multiple codewords included in an XOR stripe (e.g., CWs 610-0 to 610-N and XOR CW 620). The resultant codewords may then be stored to memory 120 (e.g., with or without address bits). Prior to encoding, address information indicating the physical addresses or LBAs for the storing of the data to memory 120 is obtained by or provided to CW assistance circuitry 116. For these examples, transform logic 722 included in assistance unit 720 may implement a non-linear transformation function of address bits included in each codeword and provide non-linear transformed address information bits to ECC encoder 112 to generate ECC parities for ECC codewords to be stored to memory 120. Transform logic 722 may also store the non-linear transformed address information bits used to generate the ECC parities in non-linear transform buffer 712.

According to some examples, the codewords (e.g., with or without address bits) may be read from memory 120 and may include possible errors. As shown in FIG. 7, an XOR rebuild of uncorrectable codeword may be initiated with assistance unit 720. In some examples, responsive to the XOR rebuild, transform logic 722 may determine whether the non-linear transformed address information bits for each codeword that was stored to non-linear transform buffer 712 can be used to generate an ECC parity that matches respective ECC parities included in each codeword read from memory 120. A match of ECC parities may verify respective physical addresses of the codewords to be used in the XOR rebuild (e.g., no right/left read reference shifts or change in page programming) match physical addresses used to generate the non-linear transformed addresses. If the physical addresses are not verified (no ECC parity match), transform logic 722 may indicate the lack of verification to XOR logic 724. If addresses are verified (matched), then transform logic 722 may indicate that addresses are verified. XOR logic 724 may then start the XOR rebuild using the address bits of each codeword as part of the rebuild.

In some examples, the XOR rebuild, for example, may include XOR logic 724 implementing a soft XOR stripe rebuild scheme such as soft XOR stripe rebuild scheme 600 described above for FIGS. 6A-D. XOR logic 724 may utilize XOR buffer 714 to store intermediate calculations associated with implementing the soft XOR stripe rebuild scheme. For example, storing soft XOR codewords, XORs of correctable data codewords or XOR rebuild codewords. XOR logic 724 may generate rebuild codeword(s) with reliability information and provide the new/rebuilt codeword(s) to ECC decoder 114. ECC decoder 114 may then make another attempt to decode the new/rebuilt codeword(s) to recover the data that was included in the codeword(s) that were uncorrectable prior to the XOR rebuild.

According to some examples, CW assistance circuitry 116 may include a processor or processor circuitry. According to some other examples CW assistance circuitry 116 may also be embodied or included in an application specific integrated circuit (ASIC) or programmable circuitry such as a field programmable gate array (FPGA). In some examples, at least some logic included in CW assistance circuitry 116 may be implemented as hardware elements of one or more ASICs or FPGAs.

According to some examples, memory 710 may include volatile types of memory such as, but not limited to, SRAM. For these examples, the SRAM of memory 710 included in and/or accessible to CW assistance circuitry 116 would be larger in capacity or size of SRAM included in typical circuitry to assist with XOR rebuilds in controller. The larger capacity to store, for example, physical address and ECC parity information included in soft XOR codewords (e.g., soft XOR CW 630). The typical circuitry, meanwhile, may only have enough SRAM capacity or size to store codeword data and its associated metadata.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 8 illustrates an example of a logic flow 800. Logic flow 800 may be representative of some or all of the operations executed by one or more logic, features, or devices described herein, such as logic and/or features included in CW assistance circuitry 116. More particularly, logic flow 800 may be implemented by one or more of transform logic 722 or XOR logic 724 of assistance unit 720.

According to some examples, as shown in FIG. 8, logic flow 800 at block 802 may receive address information for ECC codewords, the address information indicating addresses where the ECC codewords are to be written to a memory by a controller of a memory device. For these examples, XOR logic 724 may receive the address information.

In some examples, logic flow 800 at block 804 may apply an XOR or XNOR operation to address information that is not stored in the memory or apply a non-linear transformation function to the addresses where the ECC codewords are to be written. For these examples, XOR logic 724 may apply the XOR or XNOR operation or transform logic 722 may apply the non-linear transformation function.

According to some examples, logic flow 800 at block 806 may provide the address information in some form to an ECC encoder of the controller for the ECC encoder to calculate ECC parity for respective ECC codewords, wherein the ECC encoder is to generate an additional ECC codeword to be written to memory, data for the additional ECC codeword is a bitwise XOR or XNOR of the ECC codewords to be written to the memory in an XOR stripe. For these examples, transform logic 722 may provide the address information to the ECC encoder.

In some examples, logic flow 800 at block 808 may receive address information associated with reading the ECC codewords from the memory. For these examples, transform logic 722 may receive the address information.

According to some examples, logic flow 800 at block 810 may check whether or not the address information obtained from the decoded ECC codewords matches expected address information for the ECC codewords. For these examples, transform logic 722 may check the address information.

Figure 9:
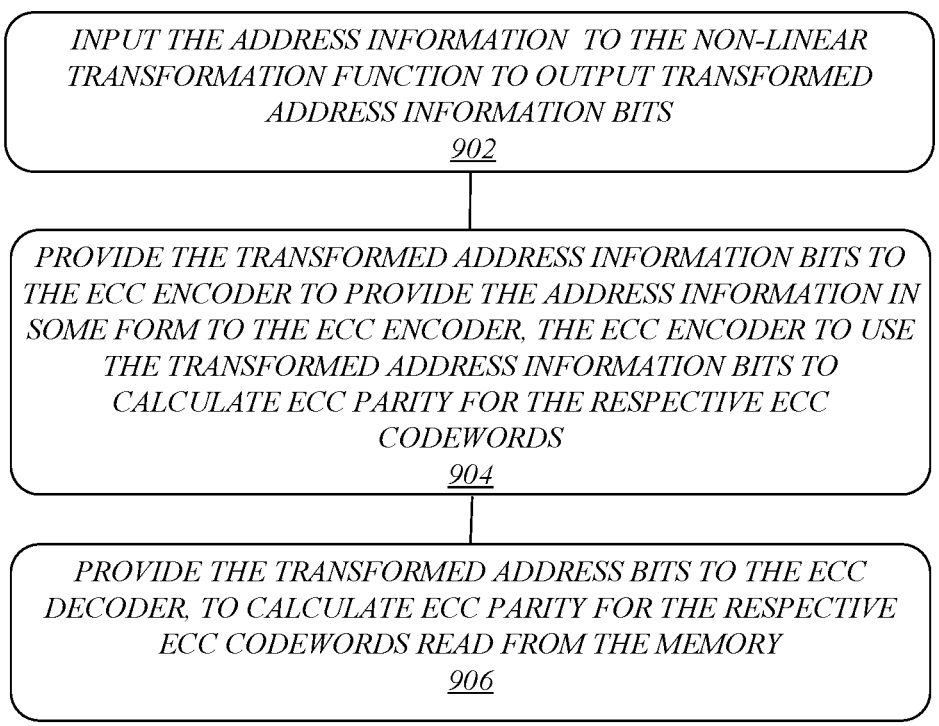
FIG. 9 illustrates an example second logic flow.

FIG. 9 illustrates an example of a logic flow 900. Logic flow 900 may be representative of some or all of the operations executed by one or more logic, features, or devices described herein, such as logic and/or features included in CW assistance circuitry 116. More particularly, logic flow 800 may be implemented by one or more of transform logic 722 or XOR logic 724 of assistance unit 720. Also, logic flow 900 is an extension of logic flow 800 and is an example of additional actions to be implemented by transform logic 722 or XOR logic 724 for the ECC codewords to be written to the memory as indicated in FIG. 8. In particular, implementing the non-linear transformation function.

According to some examples, as shown in FIG. 9, logic flow 900 at block 902 may input the address information to the non-linear transformation function to output transformed address information bits. For these examples, transform logic 722 may input the address information to the transformation function to output the transformed address bits.

In some examples, logic flow 900 at block 904 may provide the transformed address information bits to the ECC encoder to provide the address information in some form to the ECC encoder, the ECC encoder to use the transformed address information bits to calculate ECC parity for the respective ECC codewords. For these examples, transform logic 722 may provide the transformed address bits to the ECC encoder.

According to some examples, logic flow 900 at block 906 may provide the transformed address bits to the ECC decoder, to calculate ECC parity for the ECC codewords read from the memory. For these examples, transform logic 722 may provide the transformed address bits to the ECC decoder.

FIGS. 10A-B illustrate an example of a logic flow 800. Logic flow 800 may be representative of some or all of the operations executed by one or more logic, features, or devices described herein, such as logic and/or features included in CW assistance circuitry 116. More particularly, logic flow 800 may be implemented by one or more of transform logic 722 or XOR logic 724 of assistance unit 720. Also, logic flow 1000 is an extension of logic flow 800 and is an example of additional actions to be implemented by transform logic 722 or XOR logic 724 for the ECC codewords to be written to the memory as indicated in FIG. 8.

According to some examples, as shown in FIG. 10A, logic flow 1000 at block 1002 may determine separate addresses where the ECC codewords are to be written to the memory based on the address information for the ECC codewords. For these examples, XOR logic 724 may determine the separate addresses.

In some examples, logic flow 1000 at block 1004 may generate a first soft XOR codeword by a bitwise XOR of bits of each ECC codeword included in the XOR stripe that represent the separate addresses where the ECC codewords are to be written to the memory and using XOR of the separate addresses to generate an ECC parity for the first soft XOR codeword. For these examples, XOR logic 724 may generate the first soft XOR codeword.

According to some examples, logic flow 1000 at block 1006 may store the first soft XOR codeword at the controller for the memory device. For these examples, XOR logic 724 may store the soft XOR codeword in XOR buffer 814 of memory 710.

In some examples, logic flow 1000 at block 1008 may receive the ECC codewords read from the memory that are included in the XOR stripe, the ECC codewords read from the memory to include two ECC codewords having uncorrectable errors as determined by the ECC decoder. For these examples, XOR logic 724 may receive the ECC codewords included in the XOR strip that include two ECC codewords having uncorrectable errors.

According to some examples, logic flow 1000 at block 1010 may generate a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword. For these examples, XOR logic 724 may generate the second soft XOR codeword.

In some examples, as shown in FIG. 10B, logic flow 1000 at block 1012 may generate a rebuild codeword for bits of data encoded in a first ECC codeword of the two ECC codewords with uncorrectable errors, the rebuild codeword generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword, the rebuild codeword to have associated reliability information indicating a reliability of each bit included in data and ECC parity portions of the rebuild codeword. For these examples, XOR logic 724 may generate the rebuild codeword.

According to some examples, logic flow 1000 at block 1014 may compare bits included in the data and ECC parity portions of the rebuild codeword with corresponding bits included in data and ECC parity portions of the first ECC codeword. For these examples, XOR logic 724 may compare the bits.

In some examples, logic flow 1000 at block 1016 may adjust reliability information associated with each bit included in the data and ECC parity portions of the rebuild codeword to indicate a higher reliability for each bit in the data and ECC parity portions matching corresponding bits in the data and ECC parity portions of the first ECC codeword and indicate a lower reliability for each bit in the data and ECC parity portions not matching corresponding bits in the data and ECC parity portions of the first ECC codeword. For these examples, XOR logic 724 may adjust the reliability information.

According to some examples, logic flow 1000 at block 1018 may generate a new ECC codeword for the data encoded in the first ECC codeword, the new ECC codeword including the adjusted reliability information associated with each bit included in the data and ECC parity portions of the rebuild codeword, the new ECC codeword to be used by the ECC decoder to correct previously uncorrectable errors in the first ECC codeword. For these examples, XOR logic 724 may generate the new ECC codeword.

FIG. 11 illustrates an example of a first storage medium. As shown in FIG. 11, the first storage medium includes a storage medium 1100. The storage medium 1100 may comprise an article of manufacture. In some examples, storage medium 1100 may include any non-transitory computer readable medium or machine readable medium, such as an optical, magnetic or semiconductor storage. Storage medium 1100 may store various types of computer executable instructions, such as instructions to implement logic flows 800, 900 or 1000. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 12:
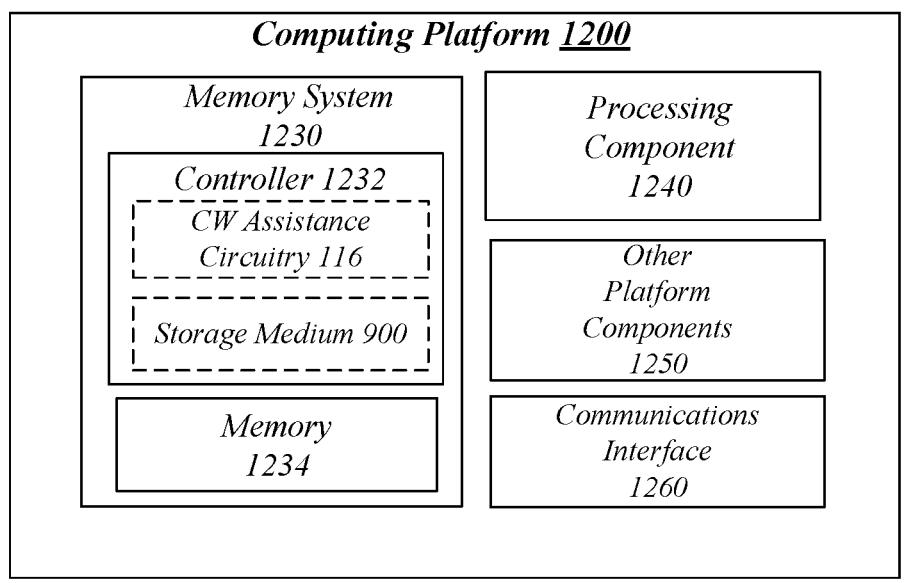
FIG. 12 illustrates an example computing platform.

FIG. 12 illustrates an example computing platform 1200. In some examples, as shown in FIG. 12, computing platform 1200 may include a memory system 1230, a processing component 1240, other platform components 1250 or a communications interface 1260. According to some examples, computing platform 1200 may be implemented in a computing device.

According to some examples, memory system 1230 may include a controller 1232 and a memory 1234. For these examples, circuitry resident at or located at controller may execute at least some processing operations or logic for CW assistance circuitry 116 and may include storage media that includes storage medium 1100. Also, memory 1234 may include similar types of non-volatile memory that are described above for systems 100, 200 or 700 shown in FIGS. 1-2 and 7 as memory 120. In some examples, controller 1232 may be part of a same die with memory 1234. In yet other examples, controller 1232 may be in a separate die or integrated circuit coupled with memory 1234. In some examples, controller 1232 and memory 1234 may be included in a memory device such as an SSD.

According to some examples, processing component 1240 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, programmable logic devices (PLD), digital signal processors (DSP), FPGA/programmable logic, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1250 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1250 or memory system 1230 may include without limitation, various types of computer readable and machine readable storage media in the form of one or more higher speed memory units, such as read-only memory (ROM), RAM, DRAM, DDR DRAM, synchronous DRAM (SDRAM), DDR SDRAM, SRAM, programmable ROM (PROM), EPROM, EEPROM, flash memory, ferroelectric memory, SONOS memory, polymer memory such as ferroelectric polymer memory, nanowire, FeTRAM or FeRAM, ovonic memory, phase change memory, memristers, STT-MRAM, magnetic or optical cards, and any other type of storage media suitable for storing information.

In some examples, communications interface 1260 may include logic and/or features to support a communication interface. For these examples, communications interface 1260 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2018, Carrier sense Multiple access with Collision Detection (CSMA/CD) Access Method and Physical Layer Specifications, Published in August 2018 (hereinafter "IEEE 802.3").

Computing platform 1200 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1200 described herein, may be included or omitted in various embodiments of computing platform 1200, as suitably desired.

The components and features of computing platform 1200 may be implemented using any combination of discrete circuitry, ASICs, logic gates and/or single chip architectures. Further, the features of computing platform 1200 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

Although not depicted, any system can include and use a power supply such as but not limited to a battery, AC-DC converter at least to receive alternating current and supply direct current, renewable energy source (e.g., solar power or motion based power), or the like.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The following examples pertain to additional examples of technologies disclosed herein.

Example 1. An example apparatus may include circuitry to receive address information for ECC codewords, the address information indicating addresses where the ECC codewords are to be written to a memory by a controller of a memory device. The circuitry may also apply an XOR or exclusive XNOR operation to address information that is not stored in the memory or apply a non-linear transformation function to the addresses where the ECC codewords are to be written. The circuitry may also provide the address information to an ECC encoder of the controller for the ECC encoder to calculate ECC parity for respective ECC codewords. The ECC encoder may generate an additional ECC codeword to be written to memory. Data for the additional ECC codeword may be a bitwise XOR or XNOR of the ECC codewords to be written to the memory in an XOR stripe. The circuitry may also receive address information associated with reading the ECC codewords from the memory. The circuitry may also provide the address information to an ECC decoder of the controller for the ECC decoder to decode the ECC codewords read from the memory. The circuitry may also check whether or not the address information obtained from decoded ECC codewords matches expected address information for the decoded ECC codewords.

Example 2. The apparatus of example 1, the circuitry to implement the non-linear transformation further includes the circuitry to input the address information to the non-linear transformation function to output transformed address information bits. The circuitry may also provide the transformed address information bits to the ECC encoder to provide the address information in some form to the ECC encoder. The ECC encoder may use the transformed address information bits to calculate ECC parity for the respective ECC codewords. The circuitry may also provide the transformed address bits to the ECC decoder. The ECC decoder may then calculate ECC parity for the respective ECC codewords read from the memory.

Example 3. The apparatus of example 1 may also include a buffer. For this example, the circuitry may also determine separate addresses where the ECC codewords are to be written to the memory based on the address information for the ECC codewords. The circuitry may also generate a first soft XOR codeword by a bitwise XOR of bits of each ECC codeword included in the XOR stripe that represent the separate addresses where the ECC codewords are to be written to the memory and use an XOR of the separate addresses to generate an ECC parity for the first soft XOR codeword. The circuitry may also store the first soft XOR codeword in the buffer. The circuitry may also receive the ECC codewords read from the memory that are included in the XOR stripe. The ECC codewords may be read from the memory to include two ECC codewords having uncorrectable errors as determined by the ECC decoder. The circuitry may also generate a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword. The circuitry may also generate a rebuild codeword for bits of data encoded in a first ECC codeword of the two ECC codewords with uncorrectable errors. The rebuild codeword may be generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword. The rebuild codeword to have associated reliability information that indicates a reliability of each bit of data included in data and ECC parity portions of the rebuild codeword. The circuitry may also compare bits included in the data and ECC parity portions of the rebuild codeword with corresponding bits included in data and ECC parity portions of the first ECC codeword. The circuitry may also adjust reliability information associated with each bit included in the data and ECC parity portions of the rebuild codeword to indicate a higher reliability for each bit in the data and ECC parity portions matching corresponding bits in the data and ECC parity portions of the first ECC codeword and indicate a lower reliability for each bit in the data and ECC parity portions not matching corresponding bits in the data and ECC parity portions of the first ECC codeword. The circuitry may also generate a new ECC codeword for the data encoded in the first ECC codeword. The new ECC codeword may include the adjusted reliability information associated with each bit included in the data and ECC parity portions of the rebuild codeword, the new ECC codeword to be used by the ECC decoder to correct previously uncorrectable errors in the first ECC codeword.

Example 4. The apparatus of example 3, the adjusted reliability information associated with each bit included in the data and ECC parity portions of the new ECC codeword may be based on a log-likelihood ratio (LLR) that indicates a number less than 0 for a given bit stored to the memory is more likely to have a value of 1 and a number greater than 0 for the given bit when read from the memory is more likely to have a value of 0.

Example 5. The apparatus of example 1, the ECC used to encode the ECC codewords included in the XOR stripe may be a low-density parity-check (LDPC) code.

Example 6. The apparatus of example 1, the memory at the memory device may be NAND flash memory or three-dimensional cross-point memory.

Example 7. The apparatus of example 6, the memory device may be a solid-state drive.

Example 8. An example method may include receiving address information for ECC codewords, the address information indicating addresses where the ECC codewords are to be written to a memory by a controller of a memory device. The method may also include applying an XOR or XNOR operation to address information that is not stored in the memory or applying a non-linear transformation function to the addresses where the ECC codewords are to be written. The method may also include providing the address information in some form to an ECC encoder of the controller for the ECC encoder to calculate ECC parity for the respective ECC codewords. The ECC encoder may generate an additional ECC codeword to be written to memory. Data for the additional ECC codeword may be a bitwise XOR or XNOR of the ECC codewords to be written to the memory in an XOR stripe. The method may also include receiving address information associated with reading the ECC codewords from the memory. The method may also include providing the address information to an ECC decoder of the controller for the ECC decoder to decode the ECC codewords read from the memory. The method may also include checking whether or not the address information obtained from decoded ECC codewords matches expected address information for the decoded ECC codewords.

Example 9. The method of example 8, implementing the non-linear transformation may further include inputting the address information to the non-linear transformation function to output transformed address information bits. The method may also include providing the transformed address information bits to the ECC encoder to provide the address information in some form to the ECC encoder, the ECC encoder to use the transformed address information bits to calculate ECC parity for the respective ECC codewords. The method may also include providing the transformed address information bits to the ECC decoder, to calculate ECC parity for the respective ECC codewords read from the memory.

Example 10. The method of example 8 may also include determining separate addresses where the ECC codewords are to be written to the memory based on the address information for the ECC codewords. The method may also include generating a first soft XOR codeword by a bitwise XOR of bits of each ECC codeword included in the XOR stripe that represent the separate addresses where the ECC codewords are to be written to the memory and using XOR of the separate addresses to generate an ECC parity for the first soft XOR codeword. The method may also include storing the first soft XOR codeword at the controller for the memory device. The method may also include receiving ECC codewords read from the memory that are included in the XOR stripe, the ECC codewords read from the memory including two ECC codewords having uncorrectable errors as determined by the ECC decoder. The method may also include generating a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword. The method may also include generating a rebuild codeword for bits of data encoded in a first ECC codeword of the two ECC codewords with uncorrectable errors, the rebuild codeword generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword. The rebuild codeword to have associated reliability information that may indicate a reliability of each bit included in data and ECC parity portions of the rebuild codeword. The method may also include comparing bits included in the data and ECC parity portions of the rebuild codeword with corresponding bits included in data and ECC parity portions of the first ECC codeword and adjusting reliability information associated with each bit included in the data and ECC parity portions of the rebuild codeword to indicate a higher reliability for each bit in the data and ECC parity portions matching corresponding bits in the data and ECC parity portions of the first ECC codeword. The method may also include indicating a lower reliability for each bit in the data and ECC parity portions not matching corresponding bits in the data and ECC parity portions of the first ECC codeword. The method may also include generating a new ECC codeword for the data encoded in the first ECC codeword. The new ECC codeword may include the adjusted reliability information associated with each bit included in the data and ECC parity portions of the rebuild codeword. The new ECC codeword may be used to correct previously uncorrectable errors in the first ECC codeword.

Example 11. The method of example 10, the adjusted reliability information associated with each bit included in the data and ECC parity portions of the new ECC codeword may be based on a log-likelihood ratio (LLR) that indicates a number less than 0 for a given bit stored to the memory is more likely to have a value of 1 and a number greater than 0 for the given bit when read from the memory is more likely to have a value of 0.

Example 12. The method of example 10, the ECC used to encode the ECC codewords included in the XOR stripe may be a low-density parity-check (LDPC) code.

Example 13. The method of example 8, the memory at the memory device may be NAND flash memory or three-dimensional cross-point memory.

Example 14. At least one machine readable medium may include a plurality of instructions that in response to being executed by a system may cause the system to carry out a method according to any one of examples 8 to 13.

Example 15. An apparatus may include means for performing the methods of any one of examples 8 to 13.

Example 16. An example controller may include an ECC encoder to encode ECC codewords included in an XOR stripe to be written to a memory. The controller may also include an ECC decoder to decode the ECC codewords included in the XOR stripe when read from the memory. The controller may also include circuitry to receive address information for the ECC codewords, the address information indicating addresses where the ECC codewords are to be written to a memory by a controller of a memory device. The circuitry may also apply an XOR or XNOR operation to address information that is not stored in the memory or apply a non-linear transformation function to the addresses where the ECC codewords are to be written. The circuitry may also provide the address information in some form to the ECC encoder to calculate ECC parity for the respective ECC codewords, wherein the ECC encoder is to generate an additional ECC codeword to be written to memory. Data for the additional ECC codeword may be a bitwise XOR or XNOR of the ECC codewords to be written to the memory in an XOR stripe. The circuitry may also receive address information associated with reading the ECC codewords from the memory. The circuitry may also provide the address information to the ECC decoder to decode the ECC codewords read from the memory and check whether or not the address information obtained from the decoded ECC codewords matches expected address information for the ECC codewords.

Example 17. The controller of example 16, the circuitry to implement the non-linear transformation may also include the circuitry to input the address information to the non-linear transformation function to output transformed address information bits. The circuitry may also provide the transformed address information bits to the ECC encoder to provide the address information in some form to the ECC encoder. The ECC encoder may use the transformed address information bits to calculate ECC parity for the respective ECC codewords. The circuitry may also provide the transformed address information bits to the ECC decoder, to calculate ECC parity for the respective ECC codewords read from the memory.

Example 18. The controller of example 16, may also include a buffer. For this example, the circuitry may determine separate addresses where the ECC codewords are to be written to the memory based on the address information for the ECC codewords. The circuitry may also generate a first soft XOR codeword by a bitwise XOR of bits of each ECC codeword included in the XOR stripe that represent the separate addresses where the ECC codewords are to be written to the memory and use an XOR of the separate addresses to generate an ECC parity for the first soft XOR codeword. The circuitry may also store the first soft XOR codeword in a first buffer accessible to the circuitry. The circuitry may also receive ECC codewords included in the XOR stripe that have been read from the memory and include two ECC codewords having uncorrectable errors as determined by the decoder. The circuitry may also generate a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword. The circuitry may also generate a rebuild codeword for bits of data encoded in a first ECC codeword of the two ECC codewords with uncorrectable errors, the rebuild codeword generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword. The rebuild codeword may be have associated reliability information indicating a reliability of each bit of data included in data and ECC parity portions of the rebuild codeword. The circuitry may also compare bits included in the data and ECC parity portions of the rebuild codeword with corresponding bits included in data and ECC parity portions of the first ECC codeword. The circuitry may also adjust reliability information associated with each bit included in the data and ECC parity portions of the rebuild codeword to indicate a higher reliability for each bit in the data and ECC parity portions matching corresponding bits in the data and ECC parity portions of the first ECC codeword and indicate a lower reliability for each bit in the data and ECC parity portions not matching corresponding bits in the data and ECC parity portions of the first ECC codeword. The circuitry may also generate a new ECC codeword for the data encoded in the first ECC codeword, the new ECC codeword including the adjusted reliability information associated with each bit included in the data and ECC parity portions of the rebuild codeword, the new ECC codeword to be used by the decoder to correct previously uncorrectable errors in the first ECC codeword.

Example 19. The controller of example 18, may include the adjusted reliability information associated with each bit included in the data and ECC parity portions of the new ECC codeword being based on a log-likelihood ratio (LLR) that indicates a number less than 0 for a given bit stored to the memory is more likely to have a value of 1 and a number greater than 0 for the given bit when read from the memory is more likely to have a value of 0.

Example 20. The controller of example 16, the ECC used to encode the ECC codewords included in the XOR stripe may be a low-density parity-check (LDPC) code.

Example 21. The controller of example 16, the memory may be NAND flash memory or three-dimensional cross-point memory included in a solid state drive.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
    circuitry to:
        receive address information for error correction code (ECC) codewords, the address information indicating addresses where the ECC codewords are to be written to a memory by a controller of a memory device;
        apply an exclusive OR (XOR) or exclusive NOR (XNOR) operation to address information that is not stored in the memory or apply a non-linear transformation function to the addresses where the ECC codewords are to be written;
        provide the address information to an ECC encoder of the controller for the ECC encoder to calculate ECC parity for respective ECC codewords, wherein the ECC encoder is to generate an additional ECC codeword to be written to memory, data for the additional ECC codeword is a bitwise XOR or XNOR of the ECC codewords to be written to the memory in an XOR stripe;
        receive address information associated with reading the ECC codewords from the memory;
        provide the address information to an ECC decoder of the controller for the ECC decoder to decode the ECC codewords read from the memory; and
        check whether or not the address information obtained from decoded ECC codewords matches expected address information for the decoded ECC codewords.

2. The apparatus of claim 1, the circuitry to implement the non-linear transformation further comprises the circuitry to:
    input the address information to the non-linear transformation function to output transformed address information bits;
    provide the transformed address information bits to the ECC encoder to provide the address information in some form to the ECC encoder, the ECC encoder to use the transformed address information bits to calculate ECC parity for the respective ECC codewords; and
    provide the transformed address bits to the ECC decoder, to calculate ECC parity for the respective ECC codewords read from the memory.

3. The apparatus of claim 1 further comprising:
    a buffer; and
    circuitry to:
        determine separate addresses where the ECC codewords are to be written to the memory based on the address information for the ECC codewords;
        generate a first soft XOR codeword by a bitwise XOR of bits of each ECC codeword included in the XOR stripe that represent the separate addresses where the ECC codewords are to be written to the memory and use an XOR of the separate addresses to generate an ECC parity for the first soft XOR codeword;
        store the first soft XOR codeword in the buffer;
        receive the ECC codewords read from the memory that are included in the XOR stripe, the ECC codewords read from the memory to include two ECC codewords having uncorrectable errors as determined by the ECC decoder;
        generate a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword;
        generate a rebuild codeword for bits of data encoded in a first ECC codeword of the two ECC codewords with uncorrectable errors, the rebuild codeword generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword, the rebuild codeword to have associated reliability information indicating a reliability of each bit of data included in data and ECC parity portions of the rebuild codeword;
        compare bits included in the data and ECC parity portions of the rebuild codeword with corresponding bits included in data and ECC parity portions of the first ECC codeword;
        adjust reliability information associated with each bit included in the data and ECC parity portions of the rebuild codeword to indicate a higher reliability for each bit in the data and ECC parity portions matching corresponding bits in the data and ECC parity portions of the first ECC codeword and indicate a lower reliability for each bit in the data and ECC parity portions not matching corresponding bits in the data and ECC parity portions of the first ECC codeword; and
        generate a new ECC codeword for the data encoded in the first ECC codeword, the new ECC codeword including the adjusted reliability information associated with each bit included in the data and ECC parity portions of the rebuild codeword, the new ECC codeword to be used by the ECC decoder to correct previously uncorrectable errors in the first ECC codeword.

4. The apparatus of claim 3, comprising the adjusted reliability information associated with each bit included in the data and ECC parity portions of the new ECC codeword is based on a log-likelihood ratio (LLR) that indicates a number less than 0 for a given bit stored to the memory is more likely to have a value of 1 and a number greater than 0 for the given bit when read from the memory is more likely to have a value of 0.

5. The apparatus of claim 1, the ECC used to encode the ECC codewords included in the XOR stripe comprises a low-density parity-check (LDPC) code.

6. The apparatus of claim 1, the memory at the memory device comprises NAND flash memory or three-dimensional cross-point memory.

7. The apparatus of claim 6, the memory device comprising a solid-state drive.

8. A method comprising:
receiving address information for error correction code (ECC) codewords, the address information indicating addresses where the ECC codewords are to be written to a memory by a controller of a memory device;
applying an exclusive OR (XOR) or exclusive NOR (XNOR) operation to address information that is not stored in the memory or applying a non-linear transformation function to the addresses where the ECC codewords are to be written;
providing the address information in some form to an ECC encoder of the controller for the ECC encoder to calculate ECC parity for the respective ECC codewords, wherein the ECC encoder is to generate an additional ECC codeword to be written to memory, data for the additional ECC codeword is a bitwise XOR or XNOR of the ECC codewords to be written to the memory in an XOR stripe;
receiving address information associated with reading the ECC codewords from the memory;
providing the address information to an ECC decoder of the controller for the ECC decoder to decode the ECC codewords read from the memory; and
checking whether or not the address information obtained from decoded ECC codewords matches expected address information for the decoded ECC codewords.

9. The method of claim 8, implementing the non-linear transformation further comprises:
inputting the address information to the non-linear transformation function to output transformed address information bits;
providing the transformed address information bits to the ECC encoder to provide the address information in some form to the ECC encoder, the ECC encoder to use the transformed address information bits to calculate ECC parity for the respective ECC codewords; and
providing the transformed address information bits to the ECC decoder, to calculate ECC parity for the respective ECC codewords read from the memory.

10. The method of claim 8, further comprising:
determining separate addresses where the ECC codewords are to be written to the memory based on the address information for the ECC codewords;
generating a first soft XOR codeword by a bitwise XOR of bits of each ECC codeword included in the XOR stripe that represent the separate addresses where the ECC codewords are to be written to the memory and using XOR of the separate addresses to generate an ECC parity for the first soft XOR codeword;
storing the first soft XOR codeword at the controller for the memory device;
receiving ECC codewords read from the memory that are included in the XOR stripe, the ECC codewords read from the memory including two ECC codewords having uncorrectable errors as determined by the ECC decoder;
generating a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword;
generating a rebuild codeword for bits of data encoded in a first ECC codeword of the two ECC codewords with uncorrectable errors, the rebuild codeword generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword, the rebuild codeword to have associated reliability information indicating a reliability of each bit included in data and ECC parity portions of the rebuild codeword;
comparing bits included in the data and ECC parity portions of the rebuild codeword with corresponding bits included in data and ECC parity portions of the first ECC codeword;
adjusting reliability information associated with each bit included in the data and ECC parity portions of the rebuild codeword to indicate a higher reliability for each bit in the data and ECC parity portions matching corresponding bits in the data and ECC parity portions of the first ECC codeword and indicate a lower reliability for each bit in the data and ECC parity portions not matching corresponding bits in the data and ECC parity portions of the first ECC codeword; and
generating a new ECC codeword for the data encoded in the first ECC codeword, the new ECC codeword including the adjusted reliability information associated with each bit included in the data and ECC parity portions of the rebuild codeword, the new ECC codeword to be used to correct previously uncorrectable errors in the first ECC codeword.

11. The method of claim 10, comprising the adjusted reliability information associated with each bit included in the data and ECC parity portions of the new ECC codeword is based on a log-likelihood ratio (LLR) that indicates a number less than 0 for a given bit stored to the memory is more likely to have a value of 1 and a number greater than 0 for the given bit when read from the memory is more likely to have a value of 0.

12. The method of claim 10, the ECC used to encode the ECC codewords included in the XOR stripe comprises a low-density parity-check (LDPC) code.

13. The method of claim 8, the memory at the memory device comprises NAND flash memory or three-dimensional cross-point memory.

14. A controller comprising:
an ECC encoder to encode error correction code (ECC) codewords included in an exclusive OR (XOR) stripe to be written to a memory;

an ECC decoder to decode the ECC codewords included in the XOR stripe when read from the memory; and
circuitry to:
receive address information for the ECC codewords, the address information indicating addresses where the ECC codewords are to be written to a memory by a controller of a memory device;
apply an exclusive OR (XOR) or exclusive NOR (XNOR) operation to address information that is not stored in the memory or apply a non-linear transformation function to the addresses where the ECC codewords are to be written;
provide the address information in some form to the ECC encoder to calculate ECC parity for the respective ECC codewords, wherein the ECC encoder is to generate an additional ECC codeword to be written to memory, data for the additional ECC codeword is a bitwise XOR or XNOR of the ECC codewords to be written to the memory in an XOR stripe;
receive address information associated with reading the ECC codewords from the memory;
provide the address information to the ECC decoder to decode the ECC codewords read from the memory;
check whether or not the address information obtained from the decoded ECC codewords matches expected address information for the ECC codewords.

15. The controller of claim 14, the circuitry to implement the non-linear transformation further comprises the circuitry to:
input the address information to the non-linear transformation function to output transformed address information bits;
provide the transformed address information bits to the ECC encoder to provide the address information in some form to the ECC encoder, the ECC encoder to use the transformed address information bits to calculate ECC parity for the respective ECC codewords;
provide the transformed address information bits to the ECC decoder, to calculate ECC parity for the respective ECC codewords read from the memory.

16. The controller of claim 14, further comprising:
a buffer; and
the circuitry to:
determine separate addresses where the ECC codewords are to be written to the memory based on the address information for the ECC codewords;
generate a first soft XOR codeword by a bitwise XOR of bits of each ECC codeword included in the XOR stripe that represent the separate addresses where the ECC codewords are to be written to the memory and use an XOR of the separate addresses to generate an ECC parity for the first soft XOR codeword;
store the first soft XOR codeword in a first buffer accessible to the circuitry;
receive ECC codewords included in the XOR stripe that have been read from the memory and include two ECC codewords having uncorrectable errors as determined by the decoder;
generate a second soft XOR codeword by a bitwise XOR of data bits encoded in each ECC codeword included in the XOR stripe that has correctable errors and by a bitwise XOR of ECC parity bits in each ECC codeword that has correctable errors and by the ECC parity bits for the first soft XOR codeword;
generate a rebuild codeword for bits of data encoded in a first ECC codeword of the two ECC codewords with uncorrectable errors, the rebuild codeword generated by a bitwise XOR of bits representing an XOR of correctable data included in the second soft XOR codeword with bits of data encoded in a second ECC codeword of the two ECC codewords with uncorrectable errors and by a bitwise XOR of bits for ECC parity of the second ECC codeword with bits for ECC parity of the second soft XOR codeword, the rebuild codeword to have associated reliability information indicating a reliability of each bit of data included in data and ECC parity portions of the rebuild codeword;
compare bits included in the data and ECC parity portions of the rebuild codeword with corresponding bits included in data and ECC parity portions of the first ECC codeword;
adjust reliability information associated with each bit included in the data and ECC parity portions of the rebuild codeword to indicate a higher reliability for each bit in the data and ECC parity portions matching corresponding bits in the data and ECC parity portions of the first ECC codeword and indicate a lower reliability for each bit in the data and ECC parity portions not matching corresponding bits in the data and ECC parity portions of the first ECC codeword; and
generate a new ECC codeword for the data encoded in the first ECC codeword, the new ECC codeword including the adjusted reliability information associated with each bit included in the data and ECC parity portions of the rebuild codeword, the new ECC codeword to be used by the decoder to correct previously uncorrectable errors in the first ECC codeword.

17. The controller of claim 16, comprising the adjusted reliability information associated with each bit included in the data and ECC parity portions of the new ECC codeword is based on a log-likelihood ratio (LLR) that indicates a number less than 0 for a given bit stored to the memory is more likely to have a value of 1 and a number greater than 0 for the given bit when read from the memory is more likely to have a value of 0.

18. The controller of claim 14, the ECC used to encode the ECC codewords included in the XOR stripe comprises a low-density parity-check (LDPC) code.

19. The controller of claim 14, the memory comprises NAND flash memory or three-dimensional cross-point memory included in a solid state drive.

* * * * *